United States Patent [19]

Kato

[11] Patent Number: 5,296,842
[45] Date of Patent: Mar. 22, 1994

[54] THUNDER ALARM

[75] Inventor: Giichiro Kato, Tokyo, Japan

[73] Assignee: Central Lightning Protection Co., Ltd., Tokyo, Japan

[21] Appl. No.: 799,177

[22] Filed: Nov. 27, 1991

Related U.S. Application Data

[63] Continuation-in-part of Ser. No. 642,649, Jan. 17, 1991, abandoned, which is a continuation-in-part of Ser. No. 516,349, Apr. 30, 1990, abandoned.

[51] Int. Cl.$^5$ .............................................. G08B 21/00
[52] U.S. Cl. ................................. 340/601; 340/602; 73/170.24; 324/72; 324/457
[58] Field of Search ........................ 340/601, 602, 647; 73/170 R; 324/72, 452, 457

[56] References Cited

U.S. PATENT DOCUMENTS

| | | | |
|---|---|---|---|
| 3,611,365 | 10/1971 | Lundquist et al. | 73/170 R |
| 3,753,117 | 8/1973 | Downing et al. | 73/170 R |
| 3,991,367 | 11/1976 | Chapman et al. | 340/647 |
| 4,095,221 | 6/1978 | Slocum, Jr. | 340/601 |
| 4,198,599 | 4/1980 | Krider et al. | 324/72 |
| 4,594,543 | 6/1986 | Eriksson et al. | 324/72 |
| 4,806,851 | 2/1989 | Krider et al. | 324/72 |
| 4,901,564 | 2/1990 | Williams et al. | 73/170 R |

FOREIGN PATENT DOCUMENTS

| | | |
|---|---|---|
| 58-000789 | 5/1983 | Japan . |
| 60-100080 | 3/1985 | Japan . |
| 60-027883 | 12/1985 | Japan . |
| 0591784 | 2/1978 | U.S.S.R. ........................ 324/72 |
| 0822105 | 4/1981 | U.S.S.R. ........................ 324/457 |
| 1247784 | 7/1986 | U.S.S.R. ........................ 324/457 |

Primary Examiner—Edward L. Coles, Sr.
Assistant Examiner—Jill Jackson
Attorney, Agent, or Firm—Rodman & Rodman

[57] ABSTRACT

The apparatus which predicts the onset of thunderstorm and the occurrence of close thunderbolts, includes a composite sensor with several metal pipes radially installed with equal separation on a hemispherical electrode. A plurality of corona needles are provided on the insulator at the end of each metal pipes, and the needles are electrically connected together within the composite sensor. The hemispherical electrode is connected to a circuit that counts the number of electric field-changes for certain time intervals. In case the receiving frequency exceeds the pre-determined level, it issues a first alarm. The groups of corona needles are connected to the circuit that measures the corona current, and issues a second alarm, in case the current a pre-determined level. In addition, the circuit includes circuitry that picks up the large amplitude corona current changes that the polarity change and issues the thunderbolt warning.

The apparatus thus has the ability to issue three different types of alarms to indicate, first that thunderclouds are approaching from a distance, second that thunderclouds are coming closer or are developing overhead, and finally that thunderbolts are approaching very close.

5 Claims, 5 Drawing Sheets

THUNDER ALARM

This is a continuation-in-part of application Ser. No. 642,649 filed Jan. 17, 1991, now abandoned, which was a continuation-in-part of application Ser. No. 516,349 filed Apr. 30, 1990, and now abandoned.

BACKGROUND OF THE INVENTION

This invention relates to a thunder alarm developed for the purposes of minimizing the occurrence of lightning accidents, such as death and injury, within a limited area which accommodates a large number of visitors, audiences, players, etc., and reducing lightning troubles in a place where numerous computers and electronic gadgets are used, by means of forecasting the approach of thundercloud in proper leading time and informing their lightning activities correctly.

In recent years, automation in factories, research laboratories, and offices has developed remarkably and the number of computers and sophisticated electric gadgets has also increased. Therefore, the prevention of computer troubles caused by lightning, has become a important task.

Factories and offices using many computers urgently need proper thunder alarms that can foretell the outbreak and the approach of thunderstorms and issue an adequate warning in good time, so that operators in such factories and offices can take effective countermeasures beforehand, such as switching the computers' power line to an installed power generator or saving data into floppy disks to protect handling memories.

Therefore, reliable thunder alarms are in contemporary demand.

As to conventional methods of lightning forecast, there are a radar method, a radio wave reception method, an electric field measurement method, etc.

1. Radar Method ( Meteorological radar )

A radio wave of a wavelength of 3~10 cm is used, and groups of precipitation particles (rain, snow, graupel, hail, etc.) which fall within clouds by the gravity, are detected as echoes. As convective clouds become thunderclouds when the top of radar echo grows higher than 7 km in summer and higher than 3 km in winter. Thundercloud can be detected by radar observation due to the above criteria.

The advantages and disadvantages of the radar method are as follows;

(1) The position and the scale of the precipitation area are measured accurately from time to time.

(2) As an outbreak of lightning is indirectly judged from the high of the precipitation echo, reliability is rather limited.

(3) The radar system is expensive and its operation requires specially-trained technicians.

2. Radio Wave Reception Method

This method is to receive electro-magnetic waves generated by lightning discharges and get the information of lightning activities, as to whether vigorous or not, and as to whether approaching or not, based on the intensity and frequency of the received signals. However, this method has the following disadvantages;

(1) As it receives radio waves generated by lightning discharges, it is impossible to forecast lightning before its outbreak.

(2) Some probability exists that radio waves generated by artificial noise sources are taken as those caused by lightning.

(3) An accurate estimation of the distance to the lightning discharges is difficult.

(4) A similar information can be obtained by noise reception, using an ordinary radio receiver.

(5) It is impossible to tell the difference between thunderbolts and cloud discharges.

As seen above, radio wave reception method, using only one receiver, is not effective and therefore, it is not widely used presently.

However, a similar but more sophisticated system called "Lightning Location and Positioning System" has been recently developed. The main features of this system are as follows:

The system consists of more than three stations each of which receives electro-magnetic waves from lightning discharges, determines their propagation directions and analyzes their waveforms to distinguish thunderbolts from cloud discharges. The obtained results are transmitted to a main station, promptly processed by computer, and the positions of thunderbolts are located.

This system can cover a wide area, e.g., an area of about 400 km in radius, with relatively high accuracy. However, as it uses radio waves, errors associated with direction finding are unavoidable. The installation of the system requires very high cost and a number of experts are also required for the operation and maintenance.

3. Electric field Measurement Method

In addition to the above-mentioned method 1 and 2, there is an electric field measurement method. This method is to measure the surface electric field and issues an alarm when the electric field exceeds certain value. In order to measure the surface electric field, there are following three methods:

(1) ROTARY ELECTRIC FIELD METER
(2) CORONA CURRENT METER
(3) DETECTOR OF ELECTRIC FIELD-CHANGES

Although the rotary electric field meter can measure the surface electric field, it contains rotating parts and needs careful maintenance.

The corona current meter has the shortcoming that the current becomes unstable at the critical field of corona current onset. It is difficult to measure corona current unless thunderclouds come closer than 10 km. If one intends to monitor an wide area it is required to install many corona current meters over the area. At the same time, communication system connecting to meters to each other is also required.

The rotary electric field meter and the corona current meter measure the surface electric field which has the most intimate relationship with nearby thunderbolts. Although the devices are suitable to detect nearby thunderbolts, it is difficult to accurately predict the occurrence of close thunderbolts merely by measuring the surface electric field, because it is also affected by space charge accumulated close to the ground surface. Some attempt was made to set up corona current needles higher than the space charge layer. However, in order to monitor a wide area, high construction expense is required, because a considerable number of corona current sensors have to be installed and the communication system has to be set up.

The detector of electric field-changes is designed to detect and count the electric field-changes caused by lightning discharges by measuring voltage change induced on a metal electrode fixed at certain height above the ground surface. When the number of field-changes detected for the predetermined time interval, exceeds a preset value, an alarm is issued. According to this method, an alarm can be issued when thunderclouds are active within a radius of about 30 km or more. However, the distance of the thunderclouds can not be accurately determined and the judgement as to whether the thunderclouds will approach or not, is also difficult.

In the case when convective clouds develop right overhead, the detection of electric field-changes begins only after lightning discharges have started and, consequently, the alarm will not be issued in time.

SUMMARY OF THE INVENTION

Among the above-mentioned three conventional methods, the present invention falls within the classification of the electric field measurement method. The present invention combines the electric field meter using corona current measurement and the detector of electric field-changes, in order to get the advantages of the two methods. While the detector of electric field-changes furnishes the information concerning the lightning activity in the distance of about 30 to 80 km, the corona current field meter provides more detailed information of lightning activity and the electrical state of thunderclouds within a radius of about 10 km.

In addition, the present invention distinguishes the signals of very close thunderbolts from those of nearby thunderbolts, based on the result of the recent analysis of electric field and field-changes under the thunderclouds. When the charge center of a thundercloud approaches the observation point at the distance of 5 to 6 km, the surface electric field becomes very strong, e.g., minus several kV/m. When the charge center comes right above the observation point, the value of the electric field diminishes markedly by the effect of overhead positive space charge which are formed by the effect of negative charge in the cloud and at the same time, the amplitude of the field-change caused by close thunderbolts increases markedly. In this situation, it is highly probable that the negative field is changed into positive one by the occurrence of a close thunderbolt (see field-changes marked by pa, pb, etc., in FIG. 2). Consequently, the field-change accompanying the polarity change is a direct indication of a very close thunderbolt. The present invention picks up such field-changes and issues the thunderbolts warning.

The present invention uses a composite sensor in which thirty stainless steel needles are radially installed on an elevated hemispherical metal electrode. The needles are used for the corona current measurement and the hemispherical metal electrode senses electric field-changes. The conventional electric field-change sensor sometimes issues faulty signal when rain drops or snow flakes hit it under very strong electric field. Because of the whole configuration of the composite sensor, it is free from such faulty operation.

The indoor unit of the present invention is covered by a compact metal case and can be easily installed on a wall. A buzzer, pilot lamps and a microammeter are installed on its front panel. Alarms are conveyed to the user both by buzzer sound and light signal.

The present invention is simple and yet capable of providing the user very useful and important information concerning the lightning activity. The information is conveyed to the user as following three stages of alarms: THE FIRST ALARM—Thunderclouds are active in a distance of about or more than 30 km and it is probable that they will approach or new thunderclouds will develop nearby. THE SECOND ALARM—Distant thunderclouds are approaching or new thunderclouds have developed nearby and it is probable that intense thunderstorms will soon come overhead. THE THUNDERBOLT WARNING—Thunderbolts are already occurring nearby and all outdoor persons should take refuge immediately.

The above information is essential to avoid fatal lightning accidents and to protect electronic gadgets from all types of lightning troubles.

The use of the present invention will be more practical than the installation of such expensive system as radar sets or so called lightning location systems. The use of the present invention together with above systems will immensely increase the effectiveness of the whole system.

FUNCTION OF THE PRESENT INVENTION

Figure 1:
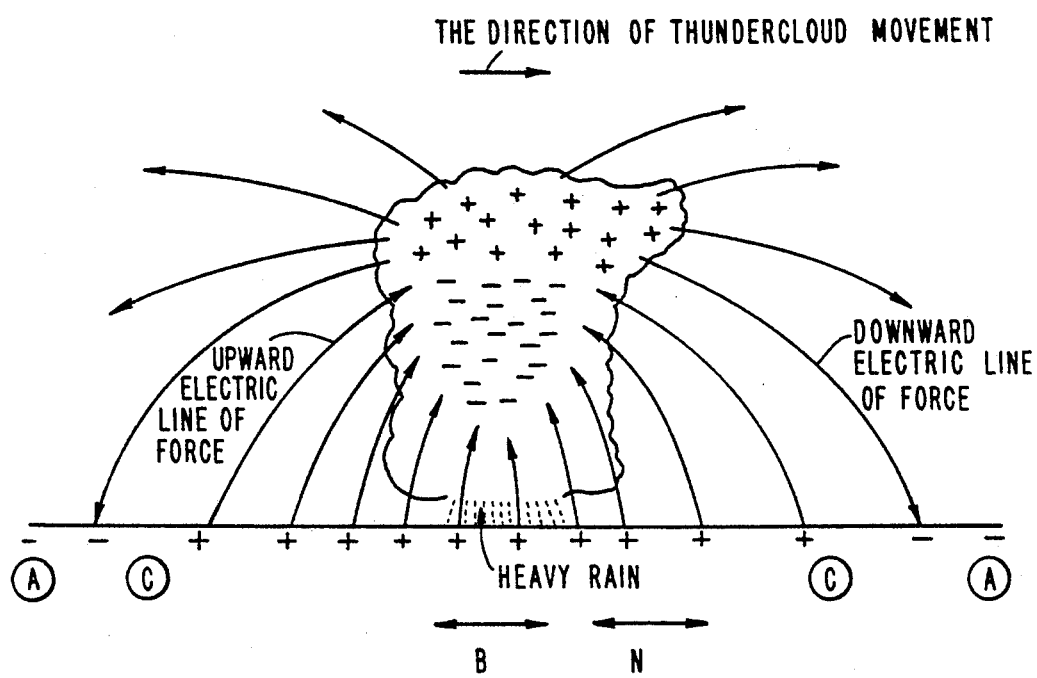
FIG. 1 is an illustration showing the relation between a model thundercloud and a surface electric field.
Figure 2:
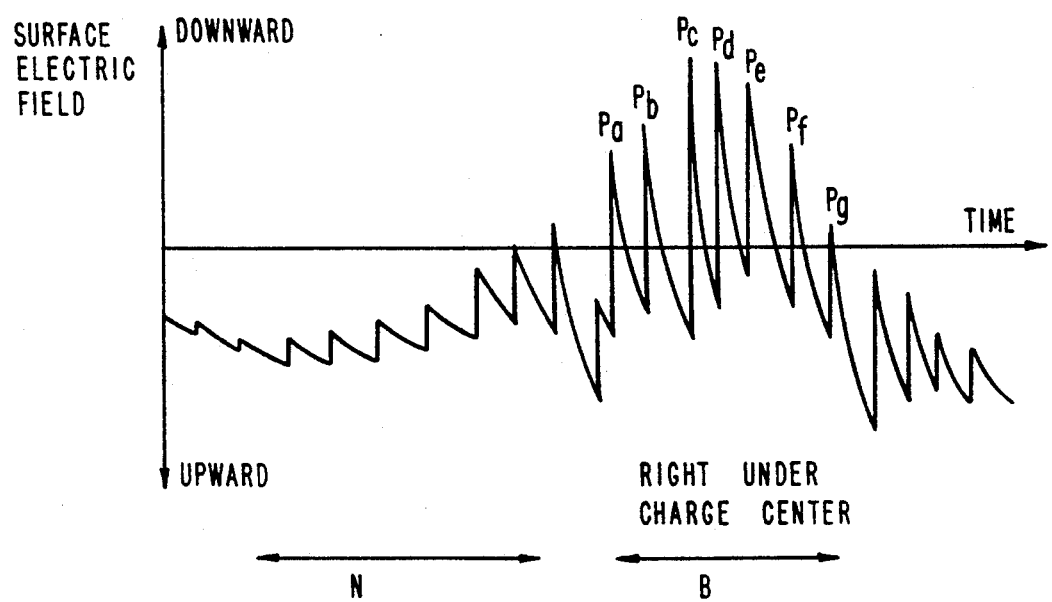
FIG. 2 shows temporal curve of the surface electric field recorded at a point (A) of FIG. 1 when the thundercloud moves in the direction of the arrow and its charge center passes over the point (A).
Figure 3:
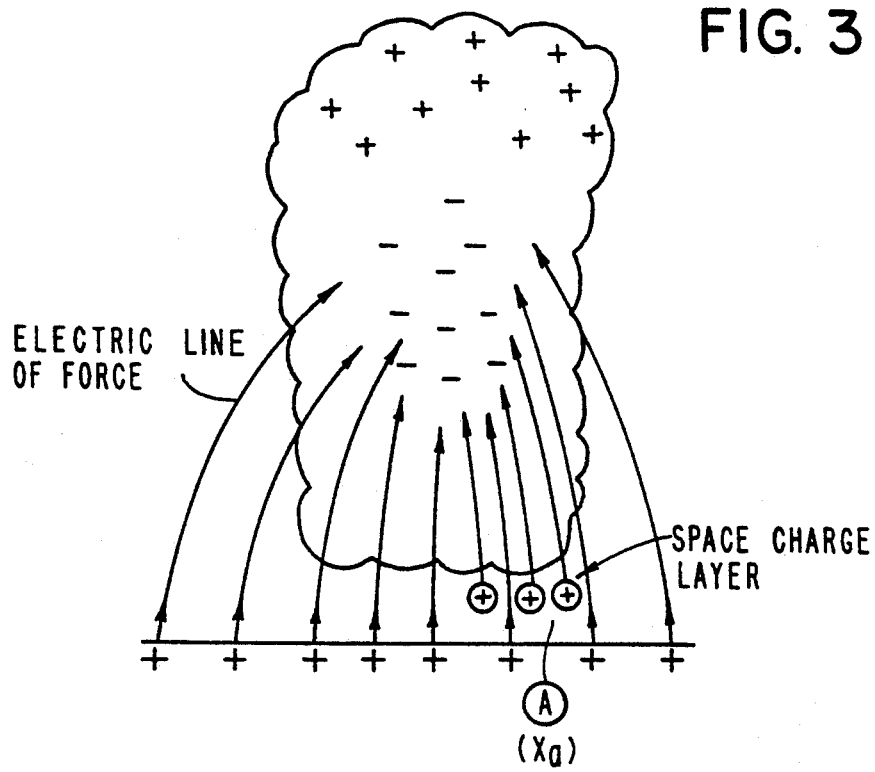
FIG. 3 is an illustration showing the charge distribution in a model thundercloud, the layer of positive space charge above the ground and the distribution of lines of electric force immediately before the occurrence of a thunderbolt (cloud-to-ground discharge.
Figure 4:
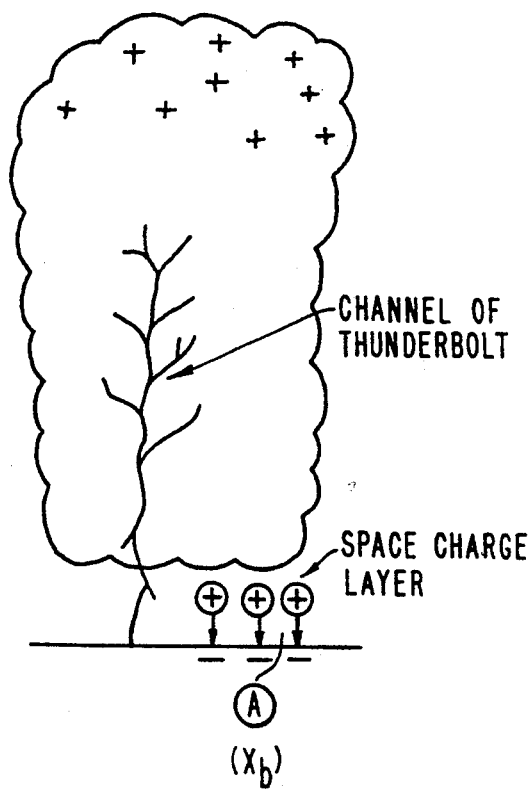
FIG. 4 is an illustration immediately after the occurrence of thunderbolt. It shows how the electric field in FIG. 3 has changed by the thunderbolt.

1. Surface Electric Field and Field-Changes under Thunderclouds and Main Function of the Present Invention FIG. 1 shows a model of thundercloud and its electric field. In the figure, the observation site indicated by (A) is a fine weather region where the surface electric field is directed downward (positive electric field). The site indicated by (B) is right under a thundercloud where the surface electric field is directed upward (negative electric field), and the site indicated by (C) is a site where the surface electric field changes its direction. FIG. 2 illustrates the temporal variation of the surface electric field recorded at site (A) in FIG. 1 during the period when the thundercloud moves in the direction of the arrow and its center passes over (A). FIG. 3 shows a typical example of a thundercloud immediately before a thunderbolt. Due to the effect of lower negative charge in the cloud, a layer of positive space charge is formed under the cloud base. FIG. 4 shows the same cloud immediately after the thunderbolt and the path of the bolt. As shown by the figure, almost all negative charge is discharged down to the ground and yet the positive space charge remains as it was before the thunderbolt. FIG. 3 and 4 show the relative situation of the cloud and site (A) at this moment. In this situation, the absolute value of electric field at (A) markedly diminishes and the amplitude of field-changes markedly increases and, consequently, the field-changes caused by the thunderbolts change their polarity as indicated by pa, pb, pc, etc., in FIG. 2.

In FIG. 2, the portion of the curve noted by N, represents the variation of electric field when the charge center of the cloud is 5 to 10 km in distance and the portion of the curve not by B represents the variation of the electric field when the charge center is about overhead.

When thunderclouds are active in a distance from 30 to 80 km, the detector of field-change in the present invention responds to their lightning activity and FIRST ALARM is issued. When thunderclouds come in the distance range of N, corona current reaches the level that SECOND ALARM is issued. When thundercloud comes overhead, the present invention responds to field-changes, accompanying polarity change(field-changes indicated by letters pa, pb, etc.) and issues THUNDERBOLT WARNING.

2. Function of the composite sensor

Figure 6:
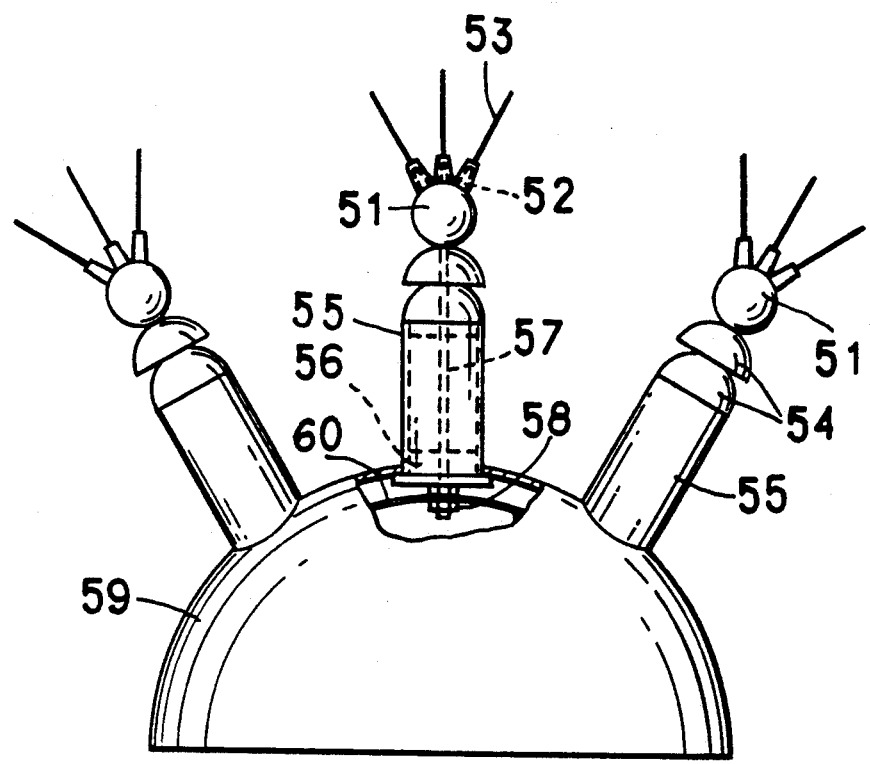
FIG. 6 is a side view showing a composite sensor which consists of a hemispherical metal electrode and of groups of corona current needles installed radially on the hemispherical electrode.

FIG. 6 shows, the composite sensor, where several metal pipes are radially installed with equal separation on the hemispherical electrode, several corona needles are put on the insulator fixed on the top of each of the metal pipes, and the needles are electrically connected together within the composite sensor.

The hemispherical electrode is connected to the circuit that counts the number of electric field-changes for certain time intervals. In case the receiving frequency exceeds the predetermined level, it issues the FIRST ALARM. The groups of corona needles are connected to the circuit that measures the corona current, and issues the SECOND ALARM, in case the current exceeds predetermined level. In addition, the said circuit includes another circuit that picks up the large amplitude corona current changes accompanying the polarity change, and issues the THUNDERBOLTS WARNING.

An umbrella-shaped insulators 54 made of porcelain or plastics is perforated in the center and is mounted on an upper end of each of metal pipe 55, radially installed on a hemispherical metal electrode 59; Six tapered bosses 52 are radially erected on an upper surface of a metal ball 51 of round shape mounted on the tip of the umbrella-shaped insulator, and corona current needles 53 having a sharp tips are radially mounted on the metal ball. These corona current needles are all electrically connected. The corona current needles, the metal ball are all made of stainless steel. Since six corona current needles are set for each metal pipe, 30 corona current needles are radially scattered on the hemisphere. Medical needles are used as corona current needles, and they are detachably mounted on tapered bosses. The numeral 56 denotes a insulator disk, 57 a shaft and 58 a connecting terminal, respectively.

The characteristic functions of the composite sensor are as follows:

(1) Usually, corona current becomes unstable at critical electric field, but the composite sensor provides relatively stable corona current because the measured current is gathered from numerous corona needles.

(2) As the sensor is used in outdoor for a long period, some of the needles are subjected to damage, by birds and insects. However, the composite sensor is not influenced in measurements, because numerous needles are used together.

(3) The corona current is commonly influenced by wind but the composite sensor contains the groups of corona needles, each of which is installed in different direction and the total effect of wind is not serious.

(4) In the composite sensor, the hemispherical electrode is covered by numerous corona needles and is not directly exposed to the strong electric field. Consequently, the hemispherical electrode is free from the faulty operation caused by collision of rain drops and snow flakes.

(5) When the center of the thundercloud comes over the composite sensor, many ions are released from the composite sensor. The space-charge layer thus formed compensates the effect of cloud negative charge and the detection of close thunderbolts becomes easier.

(6) When a strongly electric field cloud comes over the composite sensor, a large number of ions are released from the corona needles and they effectively prevent the direct thunderbolt on to the sensor.

3. Function of the whole circuits

Figure 7:
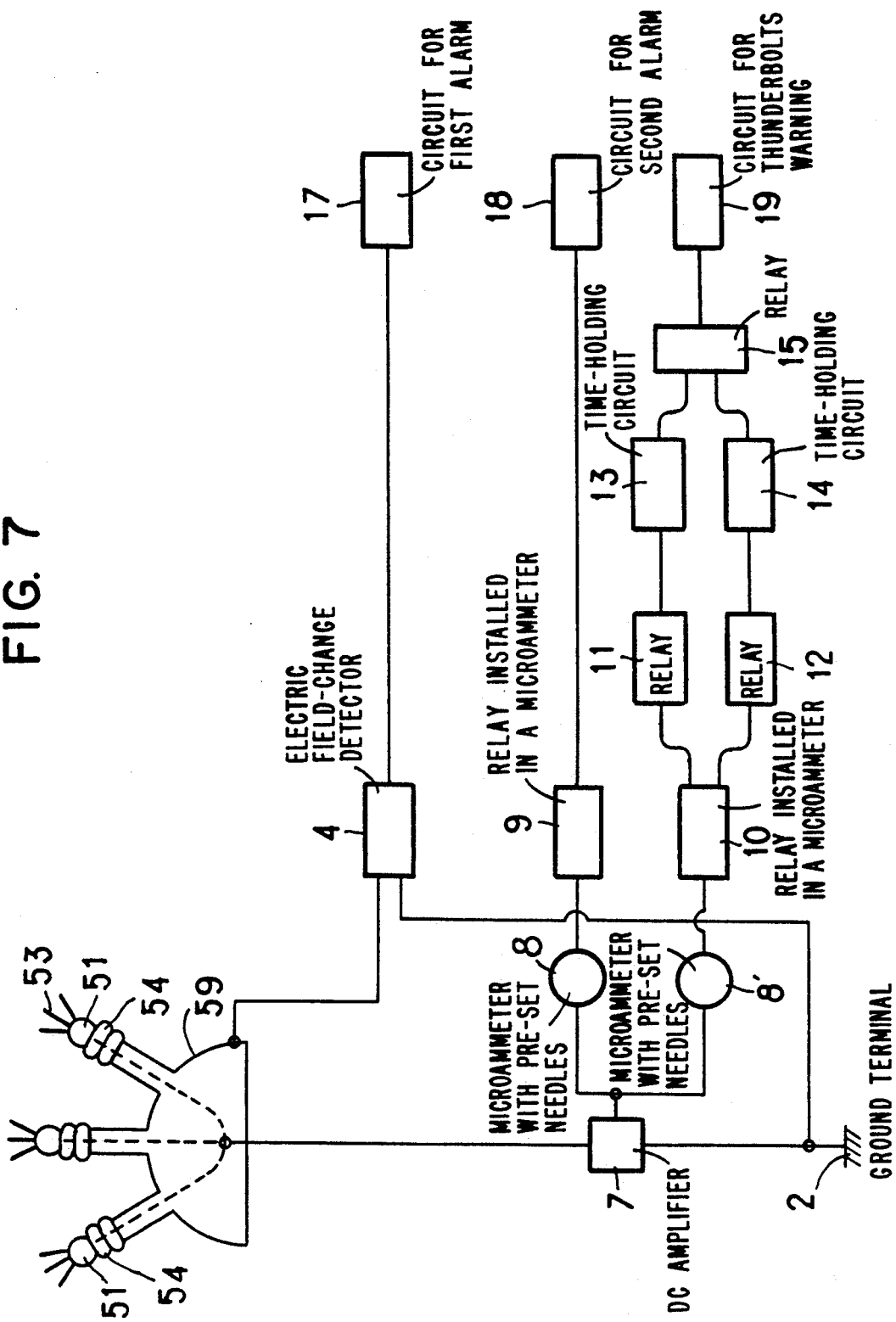
FIG. 7 is a block diagram showing the whole circuit and elements of the present invention.
Figure 8:
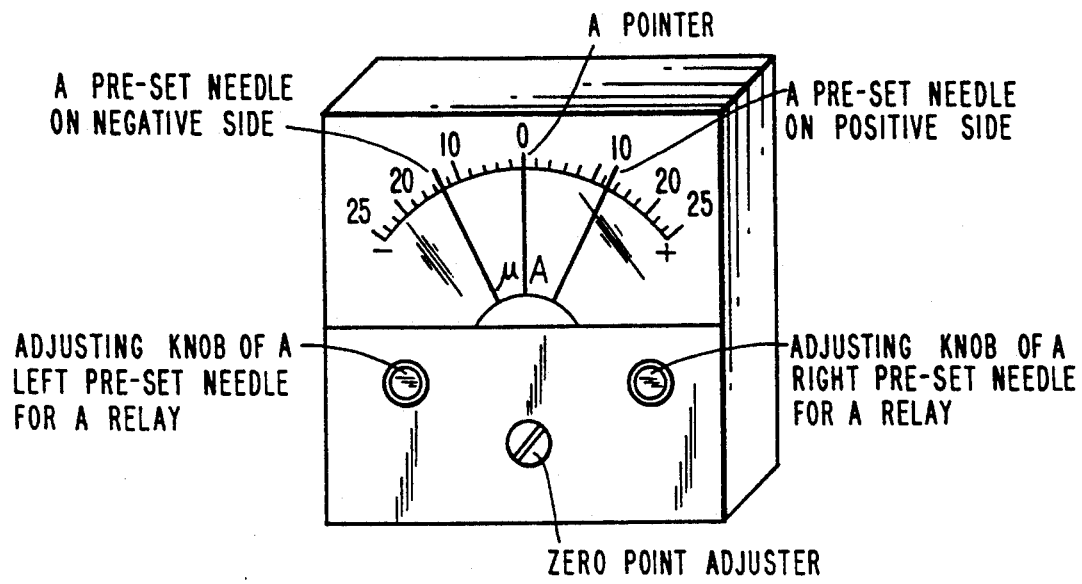
FIG. 8 is a view showing a microammeter with two needles for the adjustment of relay contacts on both sides of the zero point.

FIG. 7 show the diagram illustrating the whole circuit. the numerals on the composite sensor are already explained in the preceding section. The numeral 2 denotes a ground terminal, and 4 a detector of electric field-changes. The numeral 7 denotes a DC current amplifier which is capable of adjusting sensitivity, 8 and 8′ microammeters (see FIG. 8) with relay contacts, in which the zero point is set on center and two needles for the adjustment of relay contacts are provided on both sides. The numeral 9 and 10 denote relay circuits annexed to 8 and 8′, through which 9 and 10 are connected to the DC current amplifier 7. The relay circuit 9 annexed to a meter is actuated when currents exceed both positive and negative pre-set values. On the other hand, a contact for positive current of the relay circuit 10 is connected to the relay 11, and a contact for negative current is likewise connected to the relay 12. The numerals 13 and 14 denote delay circuits (holding time being 0.1~0.5 sec.), 15 a relay which is actuated when the contact for positive current and the contact for negative current are actuated simultaneously. The numeral 17 is a circuit for issuing a FIRST ALARM, 18 a circuit for issuing a SECOND ALARM and 19 a circuit for issuing a THUNDERBOLT WARNING.

When thunderclouds are active in a distance of 30 to 80 km, the detector 4 is actuated, it sends a signal to the alarm circuit 17 and issues a FIRST ALARM. When thunderclouds approach or develop within a radius of about 10 km, corona current reaches the values (both positive and negative values) pre-set by the needles in microammeter 8, the relay circuit 9 actuates the alarm circuit 18 and issues a SECOND ALARM.

When a thundercloud comes overhead, the corona current exceeds the negative pre-set value. When thunderbolts occur in this situation, the negative corona current changes, into the positive corona current which exceeds the positive pre-set value. At this moment the relay circuit 15 is actuated by the coincidence of delay circuits 13 and 14, and actuates the warning circuit 19 which issues a THUNDERBOLT WARNING.

Since close thunderbolts not only cause the large amplitude sudden changes of corona current but also reverse the polarity of corona current, the present circuit 19 invention detects the close thunderbolts, by picking up the large amplitude corona current change, accompanying the polarity change and thus, distinguishes very close thunderbolts from nearby thunderbolts.

The function of the meter relay system can be replaced by a logic circuit using a semiconductor.

Figure 9:
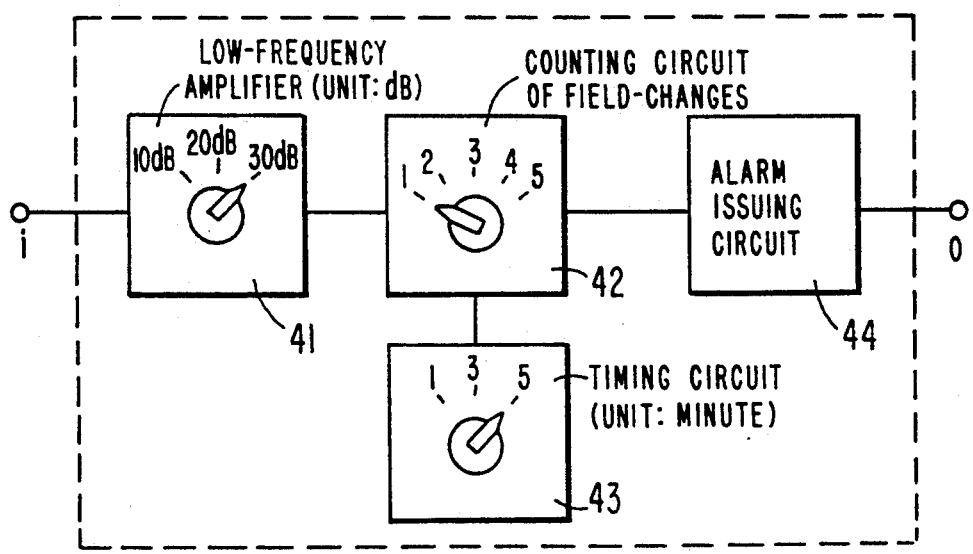
FIG. 9 shows a block diagram of a detector of field-changes, containing three sensitivity adjustment devices. In the figure, the letters i and o indicate input and output terminals respectively.

FIG. 9 is a block diagram showing a detector (in the figure, i represents an input terminal and o does an output terminal) of field-changes which comprises a low-frequency amplifier 41 with a gain switch, an counting circuit 42, a timing circuit 43, and an alarm issuing circuit 44.

The adjustment of basic sensitivity is performed by using a change-over switch of the low-frequency amplifier (usually attached with a three-stage change-over switch of 10 dB / 20 dB / 30 dB). Fine adjustment is performed by the combination of counting circuit (usually equipped with a five-stage change-over switch) and the timing circuit (usually equipped with a three-stage change-over switch of one minute, three minutes and five minutes).

In FIG. 9, sensitivity becomes the highest when the low-frequency amplifier is set to 30 dB, the counting circuit of electric field-changes to once, and the timing circuit to five minutes. The detector adjusted on this sensitivity responds to the lightning activity in the distance of 30 to 80 km.

4. Detailed Analysis of Field-Changes Caused by Close Thunderbolts

When the surface electric field is measured continuously, its sudden change caused by a thunderbolt can be treated numerically. The absolute value of the surface electric field right before thunderbolt at site A in FIG. 3, is represented by Xa and the one measured right after the thunderbolt by Xb. The magnitude of the field-change is represented by X, as the electric field is negative before the thunderbolt, the electric field itself is $-Xa$, as all cloud negative charge is discharged down to the ground, the electric field after the thunderbolt is formed by the space charge under the cloud and is positive. The magnitude X is obtained by subtracting Xb from $-Xa$, namely:

$$X = |-Xa - Xb| = Xa + Xb$$

On the other hand, according to the results of recent lightning study, it is well known that the electric potential of the center of the cloud negative charge is $10^8$ V and its height above the ground is $5 \times 10^3$ m. Therefore, the following relation can be obtained, $$X = \frac{10^8}{5 \times 10^3} = 2 \times 10^4 \text{ V/m} = 20 \text{ kV/m}$$

Therefor, even if a correct reduction factor for absolute measurement, is not available for the present sensor, an approximate absolute value of the surface electric field can be estimated. For example, if Xa and Xb are equal as show in FIG. 5 (a), the following approximate estimation can be obtain, $$Xa + Xb = X = 20 \text{ kV/m}, \quad Xa = Xb$$

thus, $Xa = Xb = 10$ kV/m and Xa and Xb is directed upward and downward respectively.

Figure 5A:
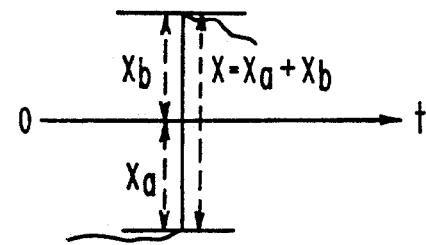
FIG. 5 (a) and 5 (b) are examples of records of electric field-changes at a point (A) in FIG. 3 and 4, caused by close thunderbolts.
Figure 5B:
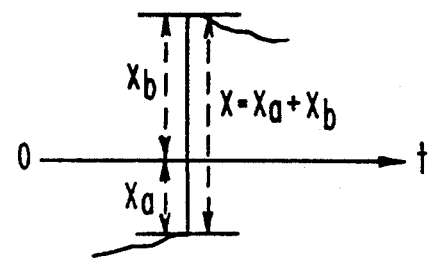

If Xb is about two times of Xa in absolute value as shown in FIG. 5 (b), the following relations can be obtained.

$$Xa + Xb = 20 \text{ kV/m}, \quad Xb = 2\,Xa$$

Thus, $Xa = 7$ kV/m and $Xb = 13$ kV/m hold approximately, Xa and Xb are directed upward and downward respectively.

The foregoing is an approximate numerical estimation for a typical thundercloud. The fact that the magnitude of the field change $Xa + Xb = X$ is large, means that the quantity of the electric charge consumed by a thunderbolt is large. The fact that ratio Xb/Xa is large means that the effect of the space charge is large. Because the space charge is formed strongest right under the center of the thundercloud, it can be judged that the larger Xb/Xa is, the closer the center of thundercloud is to the observation site. For example, if the amplitudes X, in FIG. 5 (a) and (b), are about the same and the value of Xb/Xa in FIG. 5 (b), is twice that in FIG. 5 (a), it is judged that the center of the thundercloud is closer to the observation site at the situation of FIG. 5 (b) compared with that of FIG. 5 (a).

In this way, the situation that the above-mentioned two quantity are gradually increasing, indicates that a intense thundercloud is certainly approaching.

What is claimed is:

1. An apparatus for predicting the onset of thunder storms and the occurrence of nearby thunderbolts comprising:

a sensor including a hemispherical metal electrode having a hemispherical surface and a plurality of metal pipes radially projecting from the metal surface with equal separation, said pipes each having a radially projecting end portion, each of the metal pipes having an insulating means of predetermined shape provided at the radially projecting end portion of the pipes;

a metal sphere for each said pipe affixed to the insulating means;

a predetermined number of corona needles extending from each said metal sphere;

a circuit connected to the hemispherical metal electrode, said circuit having means for counting electric field changes of a first predetermined amplitude occurring within a predetermined time interval;

means responsive to a count of said counting means for issuing a first alarm upon the count exceeding a first predetermined amount, said first alarm informing a user that thunder storms are distantly active;

wherein said corona needles are commonly connected to each other and to said circuit, said circuit further including means for measuring corona current and means for issuing a second alarm upon the corona current exceeding a predetermined level, said second alarm informing said user that thunder storms are approaching the site of the sensor; and said circuit includes a coincidence circuit connected to said corona needles, said coincidence circuit including two relays connected with respective time holding circuits, one of said relays and one of said time holding circuits responding to a positive preset corona current and the other of said relays and the other of said time holding circuits responding to a negative preset corona current, said circuit including means for detecting changes in the electric field that occur when the corona currents exceed the positive and negative preset corona currents, and means for issuing a thunderbolt warning when said changes in magnitude of electric field that correspond to corona currents beyond the positive and negative preset corona currents are at a second predetermined amount, said thunderbolt warning informing said user that thunderbolts are occurring in close proximity to said sensor and that persons in close proximity to said sensor should take immediate refuge.

2. An apparatus for predicting the onset of thunder storms and the occurrence of nearby thunderbolts comprising:

a sensor including a hemispherical metal electrode having a hemispherical surface and a plurality of metal pipes radially projecting from the metal surface with equal separation, said pipes each having a radially projecting end portion, each of the metal pipes having an insulating means of predetermined shape provided at the radially projecting end portion of the pipes;

a metal sphere for each said pipe affixed to the insulating means;

a predetermined number of corona needles extending from each said metal sphere;

a circuit connected to the hemispherical metal electrode, said circuit having means for counting electric field changes of a first predetermined amplitude occurring within a predetermined time interval;

means responsive to a count of said counting means for issuing a first alarm upon the count exceeding a first predetermined amount, said first alarm informing a user that thunder storms are distantly active;

wherein said corona needles are commonly connected to each other and to said circuit, said circuit further including means for measuring corona current and means for issuing a second alarm upon the corona current exceeding a predetermined level, said second alarm informing said user that thunder storms are approaching the site of the sensor; and said circuit connected to said hemispherical metal electrode includes a low frequency amplifier connected between said hemispherical metal electrode and said counting means, said low frequency amplifier having means for selecting a plurality of different gains.

3. The apparatus of claim 2 wherein said corona needles are medical needles and are detachably mounted to said metal balls.

4. The apparatus of claim 2 wherein said insulation means which hold said metal balls onto said metal pipes are formed of porcelain or plastic and are umbrella-shaped to provide insulation protection against rainfall.

5. An apparatus for predicting the onset of thunder storms and the occurrence of nearby thunderbolts comprising:

a sensor including a hemispherical metal electrode having a hemispherical surface and a plurality of metal pipes radially projecting from the metal surface with equal separation, said pipes each having a radially projecting end portion, each of the metal pipes having an insulating means of predetermined shape provided at the radially projecting end portion of the pipes;

a metal sphere for each said pipe affixed to the insulating means;

a predetermined number of corona needles extending from each said metal sphere;

a circuit connected to the hemispherical metal electrode, said circuit having means for counting electric field changes of a first predetermined amplitude occurring within a predetermined time interval;

means responsive to a count of said counting means for issuing a first alarm upon the count exceeding a first predetermined amount, said first alarm informing a user that thunder storms are distantly active;

wherein said corona needles are commonly connected to each other and to said circuit, said circuit further including means for measuring corona current and means for issuing a second alarm upon the corona current exceeding a predetermined level, said second alarm informing said user that thunder storms are approaching the site of the sensor;

the apparatus further includes a coincidence circuit and means for issuing a thunderbolt warning;

the means for issuing said second alarm and the means for issuing said thunderbolt warning include a DC amplifier circuit and two relays with time holding circuits, the two relays being connected to an output of said DC amplifier circuit, one of said relays and one of said time holding circuits being responsive to a positive preset current value and the other of said relays and the other of said time holding circuits being responsive to a negative preset current value; and said DC amplifier circuit is connected to a zero-center micrometer with two movable needles, one of said movable needles of said micrometer establishing said preset positive current value for operation of a first of said two relays and a second of said movable needles of said micrometer establishing said preset negative current value to adjust the operation of a second of said two relays, whereby the simultaneous operation of said two relays actuates the coincidence circuit and issues said thunderbolt warning.

* * * * *